(12) United States Patent
Lin

(10) Patent No.: US 8,083,548 B1
(45) Date of Patent: Dec. 27, 2011

(54) PROBE CONNECTOR

(75) Inventor: Jui-Pin Lin, Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/006,418

(22) Filed: Jan. 13, 2011

(51) Int. Cl.
*H01R 13/648* (2006.01)
(52) U.S. Cl. ............... 439/607.34; 439/219; 439/700
(58) Field of Classification Search ............ 439/607.34
See application file for complete search history.

(56) References Cited

U.S. PATENT DOCUMENTS

| | | | |
|---|---|---|---|
| 6,776,668 B1 * | 8/2004 | Scyoc et al. ............ | 439/700 |
| 7,320,614 B2 * | 1/2008 | Toda et al. ............. | 439/358 |
| 7,740,508 B2 * | 6/2010 | Feldman et al. ........ | 439/700 |
| 2004/0043653 A1 * | 3/2004 | Feldman .................. | 439/219 |
| 2011/0124215 A1 * | 5/2011 | Yin et al. ................ | 439/169 |

* cited by examiner

*Primary Examiner* — James Harvey

(57) ABSTRACT

A probe connector includes an insulating housing, a plurality of probe pins and a shielding shell. The insulating housing has a base body and a tongue portion. The insulating housing defines a plurality of inserting holes penetrating through the base body and the tongue portion. Two opposite surfaces of the base body defines two fastening portions. The probe pins are inserted in the inserting holes. The shielding shell has a top plate and a blocking plate extending downward from a periphery of the top plate with an accommodating chamber formed therein. The top plate defines a plurality of matching holes. The tongue portion is inserted in the accommodating chamber with the matching holes aligned with the corresponding inserting holes. Two fastening plates are protruded from two opposite bottom edges of the blocking plate. Each fastening plate has a matching fastening portion thereon for engaging with the fastening portion.

5 Claims, 3 Drawing Sheets

PROBE CONNECTOR

BACKGROUND OF THE INVENTION

1. Field of the Invention

The present invention relates to a probe connector, and more particularly to a probe connector having a shielding shell capable of being assembled to an insulating housing of the probe connector tightly.

2. The Related Art

A traditional probe connector generally includes an insulating housing, a plurality of probe pins and a shielding shell. The insulating housing has a top surface. Two sides of the top surface extend upward and then protrude towards each other to form two inverted hooks facing to each other. The top surface defines a plurality of inserting holes spaced at regular intervals. The probe pins are inserted in the inserting holes respectively. The shielding shell is mounted to the insulating housing and defines a plurality of buckling grooves for buckling the inverted hooks therein.

However, the shielding shell is fastened on the insulating housing by means of buckling the inverted hooks in the buckling grooves, the assembling manner described above is difficult to fasten the shielding shell on the insulating housing tightly, and occupied space is large.

SUMMARY OF THE INVENTION

An object of the present invention is to provide a probe connector. The probe connector includes an insulating housing, a plurality of probe pins and a shielding shell. The insulating housing has a base body. A top of the base body protrudes upward to form a tongue portion. The insulating housing defines a plurality of inserting holes vertically penetrating through the base body and the tongue portion. Two opposite surfaces of the base body respectively define a fastening portion thereon. The probe pins are inserted in the corresponding inserting holes of the insulating housing. The shielding shell encloses the tongue portion of the insulating housing. The shielding shell has a top plate and a hollow cylindrical blocking plate extending downward from a periphery edge of the top plate and has an accommodating chamber formed therein. The top plate defines a plurality of matching holes arranged in accordance with the inserting holes of the insulating housing and communicating with the accommodating chamber. The tongue portion of the insulating housing is inserted in the accommodating chamber of the shielding shell and a top side thereof abuts against the top plate of the shielding shell to make the matching holes aligned with the corresponding inserting holes. Two portions of two opposite side plates of the shielding shell engage with the fastening portions of the insulating housing. A pair of fastening plates is protruded from bottom edges of two opposite side plates of the blocking plate and facing to each other. Each of the fastening plates is provided with a matching fastening portion thereon for engaging with the fastening portion of the insulating housing.

As described above, the two matching fastening portions are engaged with the fastening portions of the insulating housing to avoid the shielding shell falling off the insulating housing. So the shielding shell can be fastened on the insulating housing tightly, and occupied space of the probe connector is accordingly smaller.

BRIEF DESCRIPTION OF THE DRAWINGS

The present invention will be apparent to those skilled in the art by reading the following description thereof, with reference to the attached drawings, in which.

DETAILED DESCRIPTION OF THE PREFERRED EMBODIMENT

Figure 1:
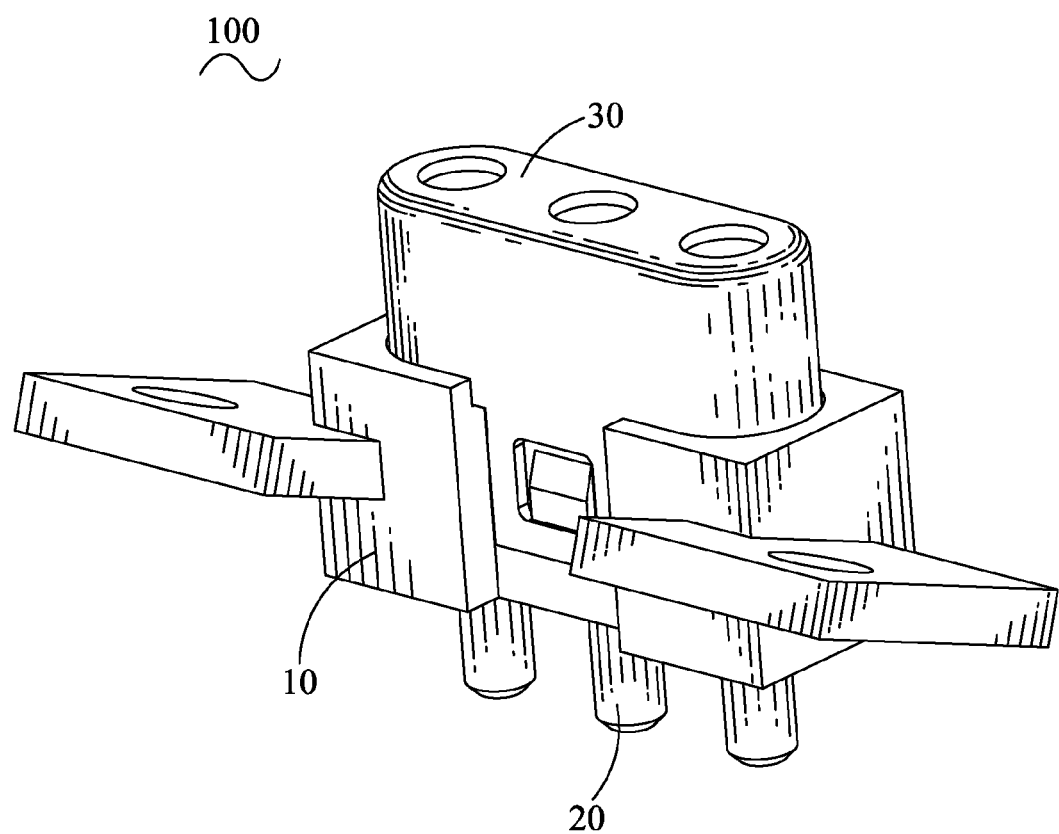
FIG. 1 is a perspective view of a probe connector according to the present invention.

With reference to FIG. 1, a probe connector 100 according to the present invention includes an insulating housing 10, a plurality of probe pins 20 and a shielding shell 30 mounted to the insulating housing 10 respectively.

Figure 2:
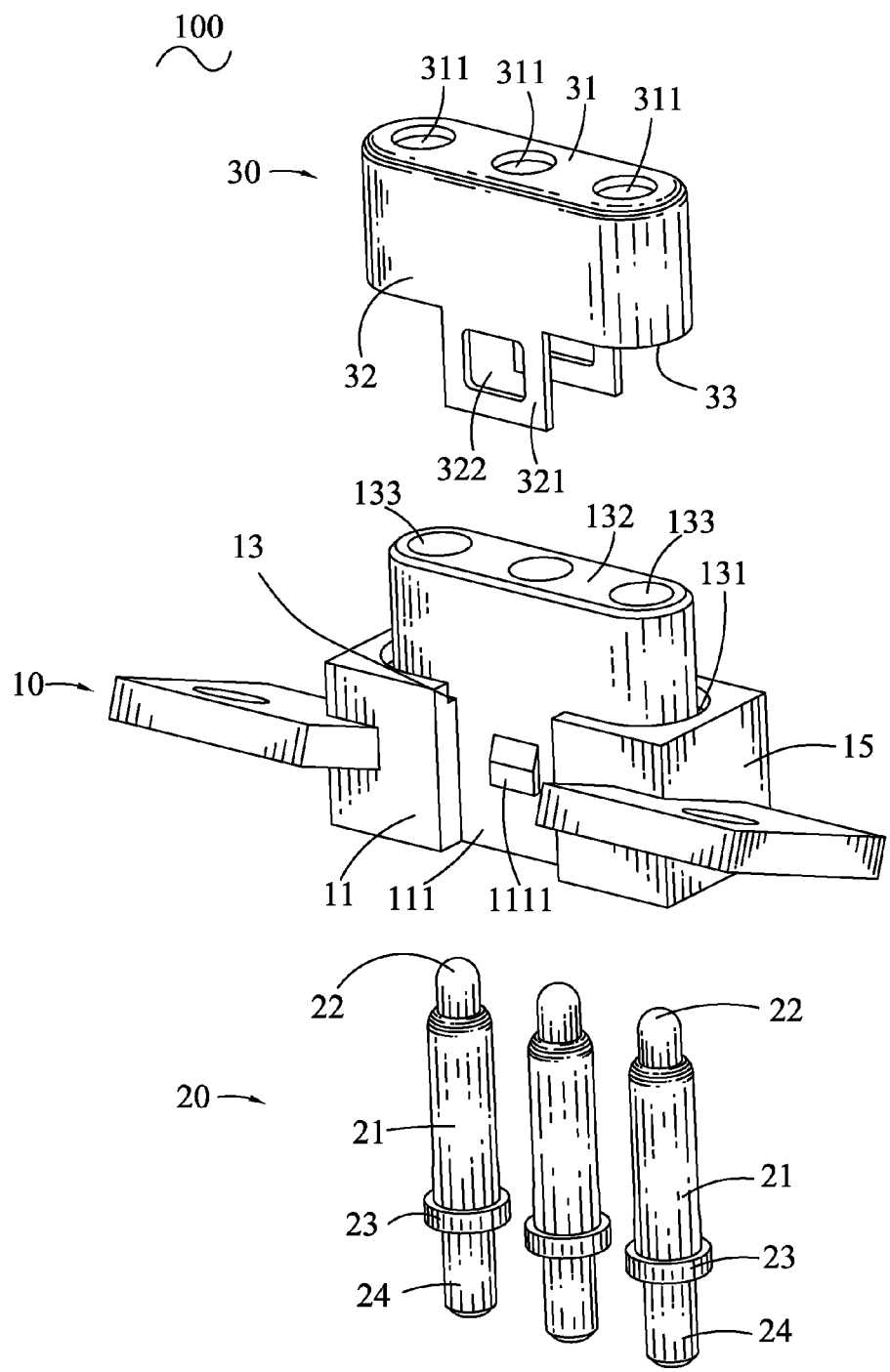
FIG. 2 is an exploded perspective view of the probe connector of FIG. 1.
Figure 3:
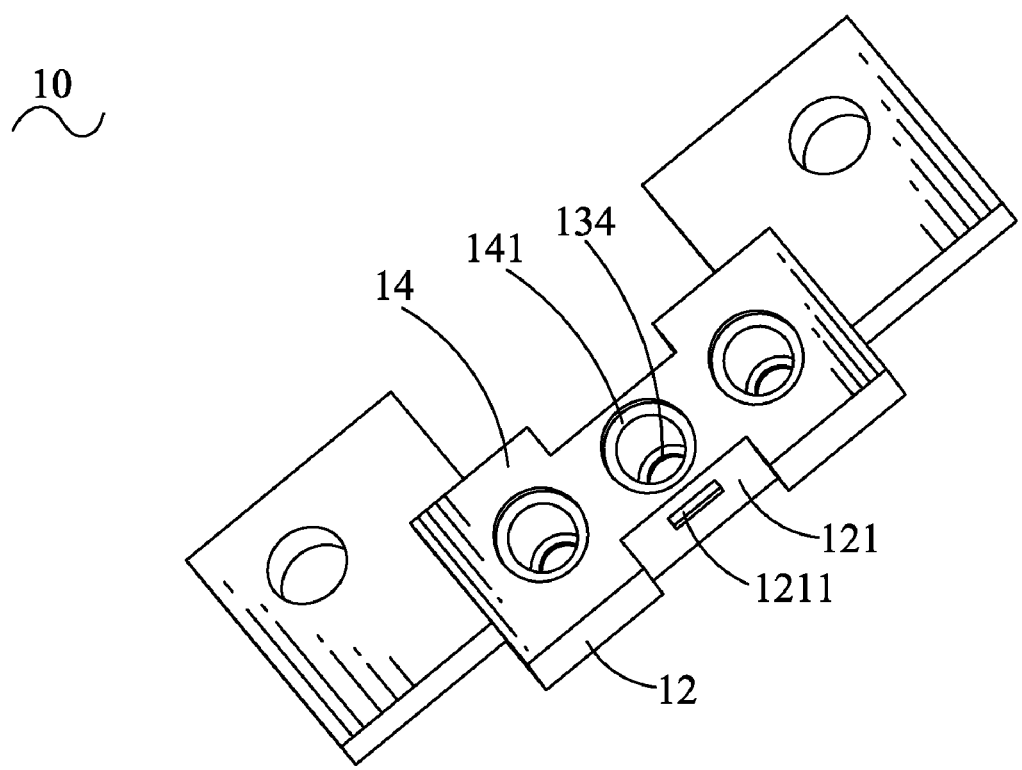
FIG. 3 is a perspective view of an insulating housing of the probe connector of FIG. 2.

Referring to FIGS. 2-3, the insulating housing 10 has a base body 15 of rectangular shape. The base body 15 has a front surface 11, a rear surface 12, a top surface 13 and a bottom surface 14. A middle of the top surface 13 of the base body 15 protrudes upward to form a tongue portion 132 of an elliptic shape viewed from a top view. The top surface 13 of the base body 15 defines an elliptical ring-shaped receiving groove 131 circling and adjacent to a bottom of the tongue portion 132. The insulating housing 10 defines a plurality of inserting holes 133 vertically penetrating through the base body 15 and the tongue portion 132. Middles of the front surface 11 and the rear surface 12 are cut off to define a first opening 111 and a second opening 121 passing through the top surface 13 of the base body 15 and connected with the receiving groove 131. A first fastening portion 1111 and a second fastening portion 1211 are respectively protruded at substantial middles of the first opening 111 and the second opening 121. An upper portion of an inner sidewall of the inserting hole 133 extends inward to form a ring-shaped blocking wall 134. A bottom end of the inserting hole 133 is further spread outward to form a fixing groove 141.

Referring to FIG. 2, the probe pin 20 has a barrel 21. A plunger 22 is movably inserted in the barrel 21 and further projects out of a top end of the barrel 21. A periphery outside of a bottom end of the barrel 21 protrudes outward to form a ring-shaped blocking portion 23. A bottom side of the barrel 21 extends downward to form a soldering portion 24.

Referring to FIGS. 2-3, the shielding shell 30 is made of metal plate, and has an elliptical top plate 31 viewed from a top view. A periphery edge of the top plate 31 extends downward to form a hollow blocking plate 32 with an accommodating chamber 33 formed therein. The top plate 31 defines a plurality of matching holes 311 arranged in accordance with the inserting holes 133 and communicating with the accommodating chamber 33. Middles of bottom edges of two opposite side plates of the blocking plate 32 extend downward to form two fastening plate 321 facing to each other. Each of the fastening plates 321 is provided with a matching fastening portion 322 thereon for engaging with the first and second fastening portion 1111, 1211 of the insulating housing 10. In this embodiment, a buckling hole 322 is acted as the matching fastening portion 322.

Referring to FIGS. 1-3, when assembling the probe connector 100, the probe pins 20 are inserted upward into the inserting holes 133 of the insulating housing 10. The plunger 22 is inserted in a top of the inserting hole 133 with a periphery of a top end of the barrel 21 resisting against a bottom of the blocking wall 134. The blocking portion 23 is fastened in the fixing groove 141. The soldering portion 24 projects beyond the bottom surface 14 of the base body 15 for being soldered on the printed circuit board (not shown). The tongue portion 132 is inserted in the accommodating chamber 33 of the shielding shell 30 to make the shielding shell 30 enclose the tongue portion 132 of the insulating housing 10. A top side of the tongue portion 132 abuts against the top plate 31 of the shielding shell 30 to make the inserting holes 133 aligned with the matching holes 311. A bottom end of the blocking plate 32 is inserted in the receiving groove 131 and clipped between an outer periphery of the tongue portion 132 and an inner sidewall of the receiving groove 131. The fastening plates 321 are disposed in the first opening 111 and the second opening 131 with the first fastening portion 1111 and the second fastening portion 1211 being buckled in the corresponding buckling holes 322, respectively.

As described above, the bottom end of the blocking plate 32 is inserted in the receiving groove 131 and clipped between the outer periphery of the tongue portion 132 and the inner sidewall of the receiving groove 131 to prevent the shielding shell 30 swaying in the receiving groove 131 and further achieve a great shielding effect. The fastening plates 321 are disposed in the first opening 111 and the second opening 131 with the first fastening portion 1111 and the second fastening portion 1211 being buckled in the buckling holes 322 to avoid the shielding shell 30 falling off the insulating housing 10. So the shielding shell 30 can be fastened on the insulating housing 10 tightly, and occupied space of the probe connector 100 is accordingly smaller.

What is claimed is:

1. A probe connector, comprising:
    an insulating housing having a base body, a top of the base body protruding upward to form a tongue portion, the insulating housing defining a plurality of inserting holes vertically penetrating through the base body and the tongue portion, two opposite surfaces of the base body respectively defining a fastening portion thereon;
    a plurality of probe pins inserted in the corresponding inserting holes of the insulating housing; and
    a shielding shell enclosing the tongue portion of the insulating housing, the shielding shell having a top plate and a hollow blocking plate extending downward from a periphery edge of the top plate and having an accommodating chamber formed therein, the top plate defining a plurality of matching holes arranged in accordance with the inserting holes of the insulating housing and communicating with the accommodating chamber, the tongue portion of the insulating housing being inserted in the accommodating chamber of the shielding shell and a top side thereof abutting against the top plate of the shielding shell to make the matching holes aligned with the corresponding inserting holes, a pair of fastening plates being protruded from bottom edges of two opposite side plates of the blocking plate and facing to each other, each of the fastening plates being provided with a matching fastening portion thereon for engaging with the fastening portion of the insulating housing.

2. The probe connector as claimed in claim 1, wherein the top of the base body defines a ring-shaped receiving groove circling and adjacent to a bottom of the tongue portion, a bottom end of the blocking plate is inserted in the receiving groove.

3. The probe connector as claimed in claim 1, wherein the base body has two openings oppositely provided at substantial middles of front and rear surfaces thereof and further enlarged to the top of the base body, the fastening portion is protruded in each opening, a buckling hole is acted as the matching fastening portion and opened in each fastening plate, the fastening plates are disposed in the openings and the fastening portions are buckled in the corresponding buckling holes.

4. The probe connector as claimed in claim 1, wherein the probe pin includes a barrel and a plunger movably inserted in the barrel and further projecting out of a top end of the barrel, a periphery outside of a bottom end of the barrel protrudes outward to form a blocking portion, a bottom end of the inserting hole is further spread outward to form a fixing groove for buckling the blocking portion therein.

5. The probe connector as claimed in claim 4, wherein a bottom side of the barrel extends downward to form a soldering portion projecting beyond a bottom surface of the base body for being soldered on a printed circuit board.

\* \* \* \* \*